(12) United States Patent
Shibata et al.

(10) Patent No.: US 10,813,221 B2
(45) Date of Patent: Oct. 20, 2020

(54) FLEXIBLE WIRING CIRCUIT BOARD, PRODUCING METHOD THEREOF, AND IMAGING DEVICE

(71) Applicant: NITTO DENKO CORPORATION, Osaka (JP)

(72) Inventors: Shusaku Shibata, Osaka (JP); Hayato Takakura, Osaka (JP); Yoshihiro Kawamura, Osaka (JP); Shuichi Wakaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/607,616

(22) PCT Filed: Apr. 25, 2018

(86) PCT No.: PCT/JP2018/016723
§ 371 (c)(1),
(2) Date: Oct. 23, 2019

(87) PCT Pub. No.: WO2018/199129
PCT Pub. Date: Nov. 1, 2018

(65) Prior Publication Data
US 2020/0077520 A1    Mar. 5, 2020

(30) Foreign Application Priority Data

Apr. 28, 2017 (JP) .................................. 2017-090243

(51) Int. Cl.
*H05K 1/03*    (2006.01)
*H05K 1/18*    (2006.01)
*H05K 3/28*    (2006.01)

(52) U.S. Cl.
CPC ............. *H05K 1/189* (2013.01); *H05K 1/036* (2013.01); *H05K 1/181* (2013.01); *H05K 3/287* (2013.01);
(Continued)

(58) Field of Classification Search
CPC .... H05K 1/0313; H05K 1/032; H05K 1/0326; H05K 1/0333; H05K 1/034;
(Continued)

(56) References Cited

U.S. PATENT DOCUMENTS

2009/0078453 A1*   3/2009   Jung .................. C08G 73/1042
                                                                                                          174/254
2013/0118788 A1    5/2013   Hishiki et al.
2018/0287086 A1*   10/2018   Kamiya .............. H01L 51/5012

FOREIGN PATENT DOCUMENTS

JP         S62-242384 A    10/1987
JP         2009-184131 A    8/2009
(Continued)

OTHER PUBLICATIONS

International Preliminary Report on Patentability Issued by WIPO dated Oct. 29, 2019, in connection with International Patent Application No. PCT/JP2018/016723.
(Continued)

*Primary Examiner* — Jeremy C Norris
(74) *Attorney, Agent, or Firm* — Edwards Neils LLC; Jean C. Edwards, Esq.

(57) ABSTRACT

A mounted board includes a base insulating layer, a conductive pattern, and a cover insulating layer sequentially toward one side in a thickness direction. The entire lower surface of the base insulating layer is exposed downwardly. A total thickness of the base insulating layer and the cover insulating layer is 16 µm or less. The base insulating layer
(Continued)

contains an insulating material having a hygroscopic expansion coefficient of $15\times10^{-6}$/% RH or less.

10 Claims, 5 Drawing Sheets

(52) U.S. Cl.
CPC ............... *H05K 2201/0154* (2013.01); *H05K 2201/10121* (2013.01); *H05K 2201/10151* (2013.01)

(58) Field of Classification Search
CPC .... H05K 1/0346; H05K 1/0353; H05K 1/036; H05K 1/0366; H05K 1/0373
See application file for complete search history.

(56) References Cited

FOREIGN PATENT DOCUMENTS

| | | |
|---|---|---|
| JP | 5099509 B2 | 12/2012 |
| JP | 2013-100441 A | 5/2013 |

OTHER PUBLICATIONS

International Search Report Issued in PCT/JP2018/016723 dated Jul. 10, 2018.
Written Opinion Issued in PCT/JP2018/016723 dated Jul. 10, 2018.

* cited by examiner

FIG.1
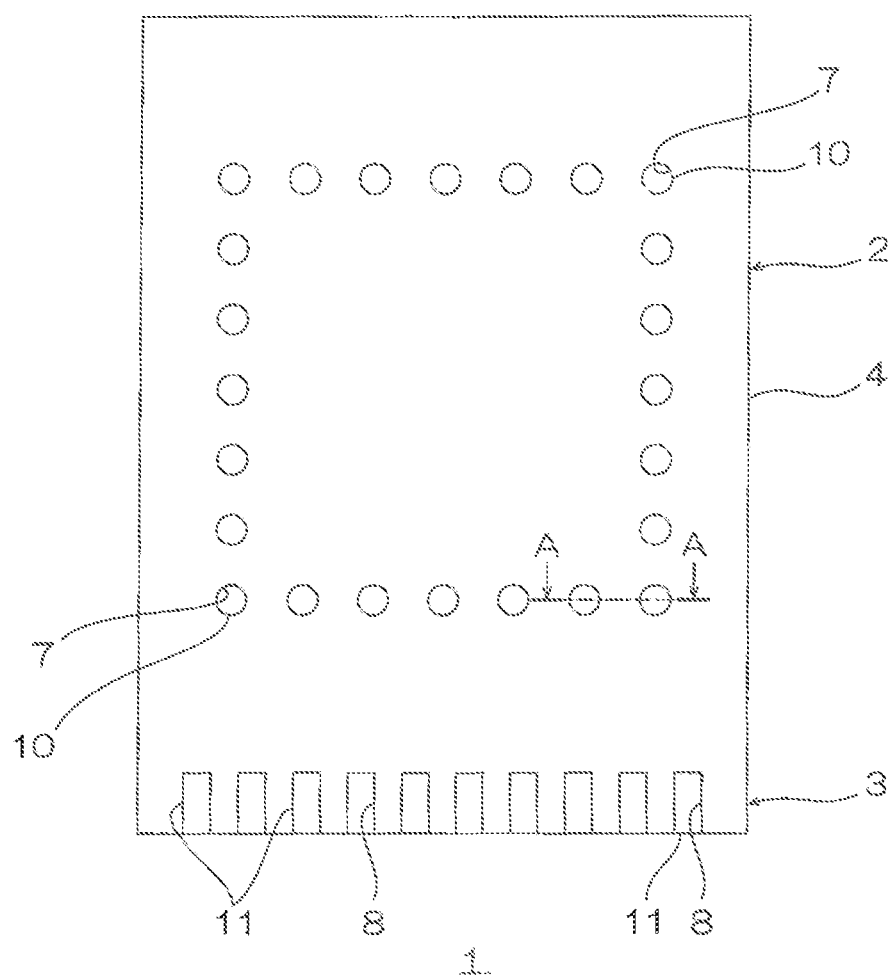
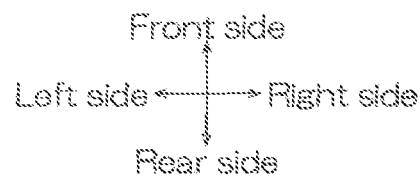

FLEXIBLE WIRING CIRCUIT BOARD, PRODUCING METHOD THEREOF, AND IMAGING DEVICE

CROSS-REFERENCE TO RELATED APPLICATIONS

The present application is a 35 U.S.C. 371 National Stage Entry of PCT/JP2018/016723, filed on Apr. 25, 2018, which claims priority from Japanese Patent Application No. 2017-090243, filed on Apr. 28, 2017, the contents of all of which are herein incorporated by reference in their entirety.

TECHNICAL FIELD

The present invention relates to a flexible wiring circuit board, a method for producing a flexible wiring circuit board, and an imaging device.

BACKGROUND ART

Conventionally, a wiring circuit board in which an insulating layer, a wire layer, and a cover layer are laminated in this order has been known. As the wiring circuit board, a wiring circuit board including a metal supporting body on the rear surface of the insulating layer has been known (ref: for example, Patent Document 1).

CITATION LIST

Patent Document

Patent Document 1: Japanese Unexamined Patent Publication No. 2013-100441

SUMMARY OF THE INVENTION

Problem to be Solved by the Invention

There is a disadvantage that when a thickness of the wiring circuit board is reduced, for example, a total thickness of the insulating layer and the cover layer is reduced, warping easily occurs.

Meanwhile, it is considered that the above-described wiring circuit board includes the metal supporting body on the rear surface of the insulating layer, so that the above-described warping can be suppressed by the metal supporting body. However, there is a disadvantage that when the total thickness of the insulating layer and the cover layer is thin, conversely, the above-described warping becomes obvious.

An object of the present invention is to provide a flexible wiring circuit board that is capable of achieving a reduction in thickness and suppressing warping, a method for producing a flexible wiring circuit board, and an imaging device.

Means for Solving the Problem

The present invention (1) includes a flexible wiring circuit board including a first insulating layer, a conductive pattern, and a second insulating layer sequentially toward one side in a thickness direction, wherein the entire other-side surface in the thickness direction of the first insulating layer is exposed toward the other side in the thickness direction, a total thickness of the first insulating layer and the second insulating layer is 16 μm or less, and at least the first insulating layer contains an insulating material having a hygroscopic expansion coefficient of $15 \times 10^{-6}$/% RH or less.

The present invention (2) includes the flexible wiring circuit board described in (1), wherein the insulating material is a polyimide containing a structure unit represented by the following formula (1).

Formula (1):

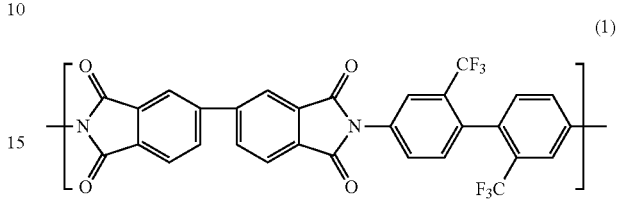

The present invention (3) includes the flexible wiring circuit board described in (1) or (2), wherein the conductive pattern has a terminal exposed from the first insulating layer toward the other side in the thickness direction.

The present invention (4) includes the flexible wiring circuit board described in any one of (1) to (3), wherein a part of the conductive pattern is exposed from the second insulating layer toward one side in the thickness direction.

The present invention (5) includes the flexible wiring circuit board described in any one of (1) to (4) further including a shield layer and a third insulating layer and including the first insulating layer, the conductive pattern, the second insulating layer, the shield layer, and the third insulating layer sequentially toward one side in the thickness direction, wherein a total thickness of the first insulating layer, the second insulating layer, and the third insulating layer is 16 μm or less.

The present invention (6) includes the flexible wiring circuit board described in (5), wherein the third insulating layer contains an insulating material having a hygroscopic expansion coefficient of $15 \times 10^{-6}$/% RH or less.

The present invention (7) includes the flexible wiring circuit board described in any one of (1) to (6) being an imaging element-mounting board for mounting an imaging element.

The present invention (8) includes an imaging device including the imaging element-mounting board described in (7) and an imaging element mounted on the imaging element-mounting board.

The present invention (9) includes a method for producing the flexible wiring circuit board described in any one of (1) to (7) including the steps of preparing a metal supporting board, forming a first insulating layer, a conductive pattern, and a second insulating layer sequentially at one side in a thickness direction of the metal supporting board, and removing the metal supporting board.

Effect of the Invention

In the flexible wiring circuit board of the present invention, the total thickness of the first insulating layer and the second insulating layer is thin of 16 μm or less, so that a reduction in thickness can be achieved.

In the flexible wiring circuit board of the present invention, the entire other-side surface in the thickness direction of the first insulating layer is exposed toward the other side in the thickness direction and at least the first insulating layer contains the insulating material having a low hygroscopic expansion coefficient of 15×10$^{-6}$/% RH or less, so that the warping can be suppressed.

The imaging device of the present invention includes the above-described flexible wiring circuit board as the imaging element-mounting board, so that a reduction in thickness can be achieved, and the connection reliability can be improved.

According to the method for producing a flexible wiring circuit board of the present invention, the flexible wiring circuit board that is capable of achieving a reduction in thickness and suppressing the warping can be obtained.

BRIEF DESCRIPTION OF THE DRAWINGS

FIG. 1 shows a bottom view of an imaging element-mounting board that is one embodiment of a flexible wiring circuit board of the present invention.

FIG. 3A illustrating a step of preparing a metal supporting body and a step of forming a base insulating layer, FIG. 3B illustrating a step of forming a conductive pattern, FIG. 3C illustrating a step of forming a cover insulating layer, and FIG. 3D illustrating a step of removing the metal supporting body.

FIG. 6A illustrating a step of preparing a board assembly sheet including a plurality of mounting boards and FIG. 6B illustrating a step of measuring a height of lower end portions of the peaks in the board assembly sheet.

DESCRIPTION OF EMBODIMENTS

In FIG. 1, the up-down direction on the plane of the sheet is a front-rear direction (first direction), the upper side on the plane of the sheet is a front side (one side in the first direction), and the lower side on the plane of the sheet is a rear side (the other side in the first direction).

In FIG. 1, the right-left direction on the plane of the sheet is a right-left direction (second direction perpendicular to the first direction), the left side on the plane of the sheet is a left side (one side in the second direction), and the right side on the plane of the sheet is a right side (the other side in the second direction).

In FIG. 1, the paper thickness direction on the plane of the sheet is an up-down direction (one example of a thickness direction, a third direction perpendicular to the first direction and the second direction), the far side on the plane of the sheet is an upper side (one example of one side in the thickness direction, one side in the third direction), and the near side on the plane of the sheet is a lower side (one example of the other side in the thickness direction, the other side in the third direction).

To be specific, directions are in conformity with direction arrows described in each view.

One Embodiment

1. Imaging Element-Mounting Board

An imaging element-mounting board 1 (hereinafter, may be simply referred to as a mounting board 1) that is one embodiment of a flexible wiring circuit board of the present invention is described.

Figure 4:
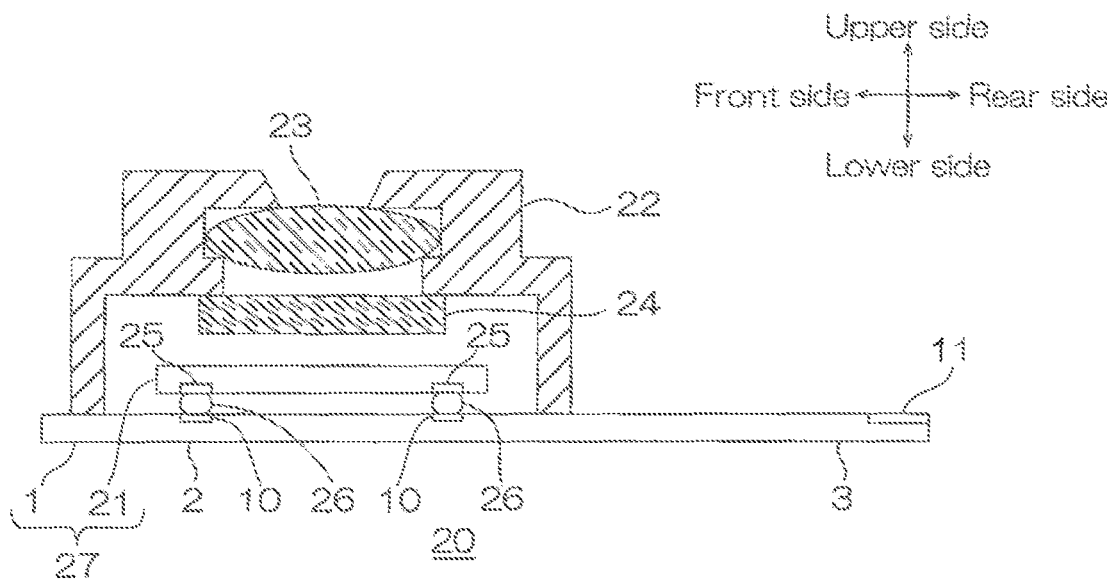
FIG. 4 shows an imaging device including the imaging element-mounting board shown in FIG. 2.

As shown in FIG. 1, the mounting board 1 is a flexible wiring circuit board (FPC) for mounting an imaging element 21 (described later, ref: FIG. 4), and does not include the imaging element 21 yet. The mounting board 1 has a generally rectangular (rectangle-shaped) flat plate shape (sheet shape) when viewed from the top extending in the front-rear direction and the right-left direction (plane direction).

The mounting board 1 includes a housing disposed portion 2 and an external component connecting portion 3.

The housing disposed portion 2 is a portion in which a housing 22 (described later, ref: FIG. 4) and the imaging element 21 are disposed. To be specific, in a case where the housing 22 is disposed in the mounting board 1, the housing disposed portion 2 is a portion that is overlapped with the housing 22 when projected in the thickness direction. As one example of a terminal, a plurality of imaging element connecting terminals 10 (described later) for being electrically connected to the imaging element 21 are disposed in a generally central portion of the housing disposed portion 2.

The external component connecting portion 3 is a region other than the housing disposed portion 2, and a portion for being connected to an external component. The external component connecting portion 3 is disposed at the rear side of the housing disposed portion 2 so that the front end edge thereof is continuous to the rear end edge of the housing disposed portion 2. In the rear end edge of the external component connecting portion 3, as one example of a terminal, a plurality of external component connecting terminals 11 (described later) for being electrically connected to an external component are disposed.

Figure 2:
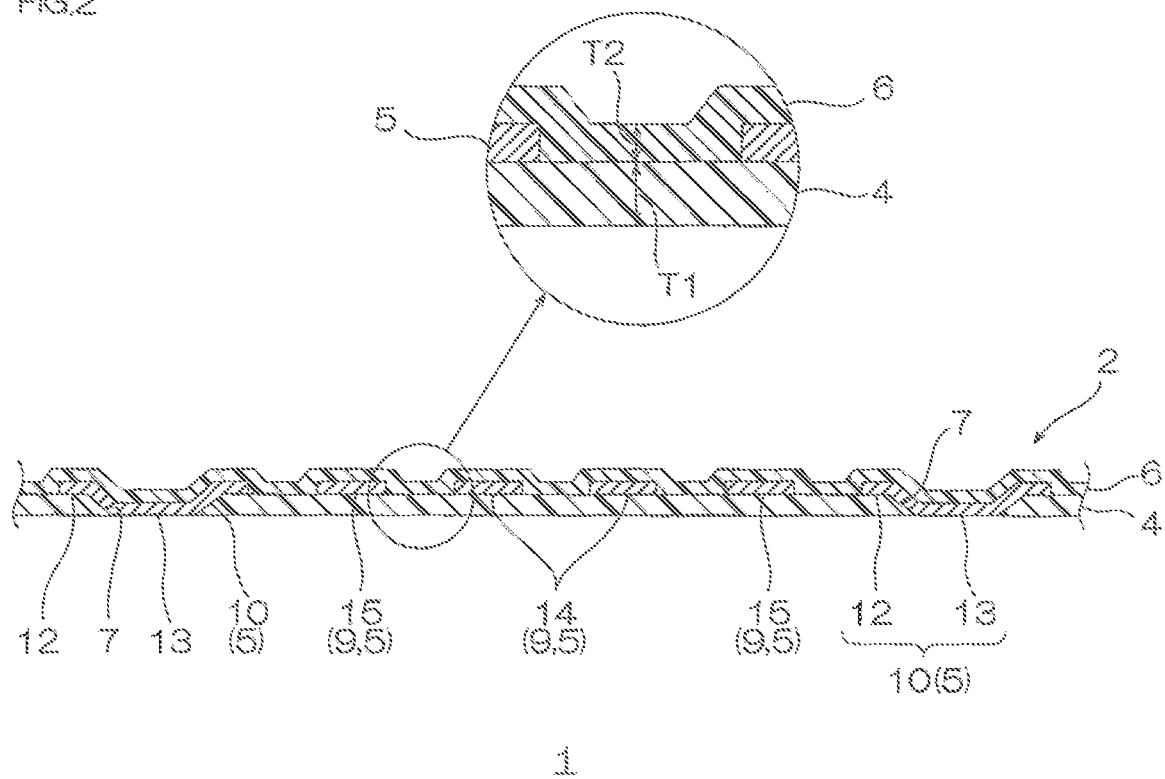
FIG. 2 shows an A-A cross-sectional view in the imaging element-mounting board shown in FIG. 1.

As shown in FIG. 2, the mounting board 1 sequentially includes a base insulating layer 4 as one example of a first insulating layer, a conductive pattern 5, and a cover insulating layer 6 as one example of a second insulating layer upwardly (one example of one side in the thickness direction).

The base insulating layer 4 forms the outer shape of the mounting board 1, and has a generally rectangular shape when viewed from the bottom. The base insulating layer 4 forms the lower layer of the mounting board 1. The lower surface (one example of the other-side surface in the thickness direction) of the base insulating layer 4 is formed flat. The entire lower surface of the base insulating layer 4 is exposed downwardly (one example of the other side in the thickness direction). To be more specific, the base insulating layer 4 is positioned at the lowermost layer of the mounting board 1, the lower surface of the base insulating layer 4 is not supported by a metal supporting body (ref: a code 19 of FIGS. 3A to 3C) described in Patent Document 1, and accordingly, the mounting board 1 does not include the metal supporting body 19 (metal supporting layer).

In the base insulating layer 4, a plurality of imaging element opening portions 7 and a plurality of external component opening portions 8 (ref: FIG. 1) are formed.

The plurality of imaging element opening portions 7 are opening portions for exposing the imaging element connecting terminals 10 from the lower surface. As shown in FIG. 1, the plurality of imaging element opening portions 7 are disposed in alignment at spaced intervals to each other so as to have rectangular frame shapes in the central portion of the housing disposed portion 2. As shown in FIG. 2, each of the plurality of imaging element opening portions 7 has a generally circular shape when viewed from the bottom passing through the base insulating layer 4 in the up-down direction. The imaging element opening portion 7 has a tapered shape in which the opening cross-sectional area decreases as it is closer to the lower side.

The plurality of external component opening portions 8 are opening portions for exposing the external component connecting terminals 11 from the lower surface. The external component opening portions 8 are disposed in alignment at spaced intervals to each other in the right-left direction in the rear end edge of the external component connecting portion 3. Each of the plurality of external component opening portions 8 has a generally rectangular shape (rectangle-shaped) when viewed from the bottom passing through the base insulating layer 4 in the up-down direction. The external component opening portion 8 is formed so as to extend from the rear end edge of the external component connecting portion 3 forwardly when viewed from the bottom.

The base insulating layer 4 contains an insulating material.

As the insulating material, a material that satisfies a hygroscopic expansion coefficient (CHE) to be described next is selected. As the insulating material, one that has a desired hygroscopic expansion coefficient is selected from synthetic resins such as polyimide, polyamide imide, acryl, polyether nitrile, polyether sulfone, polyethylene terephthalate, polyethylene naphthalate, and polyvinyl chloride. As the insulating material, preferably, in view of insulating properties, heat resistance, and chemical resistance, a polyimide is used.

The polyimide is, for example, a reaction product (cured product) obtained by reacting an acid dianhydride component with a diamine component.

Examples of the acid dianhydride component include aromatic acid dianhydride and aliphatic acid dianhydride.

Examples of the aromatic acid dianhydride include pyromellitic dianhydride, benzophenonetetracarboxylic dianhydride such as 3,3',4,4'-benzophenonetetracarboxylic dianhydride and 2,2',3,3'-benzophenonetetracarboxylic dianhydride, biphenyltetracarboxylic dianhydride such as 3,3',4,4'-biphenyltetracarboxylic dianhydride (BPDA), 2,2',3,3'-biphenyltetracarboxylic dianhydride, 2,3,3',4'-biphenyltetracarboxylic dianhydride, and 2,2',6,6'-biphenyltetracarboxylic dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)phenoxy]phenyl}propane dianhydride, 2,2-bis{4-[3-(1,2-dicarboxy)phenoxy]phenyl}propane dianhydride, bis{4-[4-(1,2-dicarboxy)phenoxy]phenyl}ketone dianhydride, bis{4-[3-(1,2-dicarboxy)phenoxy]phenyl}ketone dianhydride, 4,4'-bis[4-(1,2-dicarboxy)phenoxy]biphenyl dianhydride, 4,4'-bis[3-(1,2-dicarboxy)phenoxy]biphenyl dianhydride, bis{4-[4-(1,2-dicarboxy)phenoxy]phenyl}ketone dianhydride, bis{4-[3-(1,2-dicarboxy)phenoxy]phenyl}ketone dianhydride, bis{4-[4-(1,2-dicarboxy)phenoxy]phenyl}sulfone dianhydride, bis{4-[3-(1,2-dicarboxy)phenoxy]phenyl}sulfone dianhydride, bis{4-[4-(1,2-dicarboxy)phenoxy]phenyl}sulfide dianhydride, bis{4-[3-(1,2-dicarboxy)phenoxy]phenyl}sulfide dianhydride, 2,2-bis{4-[4-(1,2-dicarboxy)phenoxy]phenyl}-1,1,1,3,3,3,-hexaflupropane dianhydride, 2,2-bis{4-[3-(1,2-dicarboxy)phenoxy]phenyl}-1,1,1,3,3,3,-hexafluoropropane dianhydride, 2,3,6.7-naphthalenetetracarboxylic dianhydride, 1,4,5,8-naphthalenetetracarboxylic dianhydride, 1,2,5,6-naphthalenetetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride, and 1,2,7,8-phenanthrenetetracarboxylic dianhydride.

Examples of the aliphatic acid dianhydride include ethylenetetracarboxylic dianhydride, butanetetracarboxylic dianhydride, cyclobutanetetracarboxylic dianhydride, and cyclopentanetetracarboxylic dianhydride.

As the acid dianhydride component, preferably, in view of obtaining excellent heat resistance, an aromatic acid dianhydride is used, more preferably, in view of reducing a hygroscopic expansion coefficient, a biphenyltetracarboxylic dianhydride is used, further more preferably, BPDA is used.

Examples of the diamine component include aromatic diamine and aliphatic diamine Examples of the aromatic diamine include phenylenediamine such as p-phenylenediamine (PPD), m-phenylenediamine, and o-phenylenediamine, diaminodiphenyl ether such as 3,3'-diaminodiphenyl ether, 3,4'-diaminodiphenyl ether, and 4,4'-diaminodiphenyl ether, diaminodiphenyl sulfide such as 3,3'-diaminodiphenyl sulfide, 3,4'-diaminodiphenyl sulfide, and 4,4'-diaminodiphenyl sulfide, diaminodiphenyl sulfone such as 3,3'-diaminodiphenyl sulfone, 3,4'-diaminodiphenyl sulfone, and 4,4'-diaminodiphenyl sulfone, diaminobenzophenone such as 3,3'-diaminobenzophenone, 4,4'-diaminobenzophenone, and 3,4'-diaminobenzophenone, diaminodiphenyl alkane such as 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3,-hexafluoropropane, 2,2-di(4-aminophenyl)-1,1,1,3,3,3,-hexafluoropropane, 2-(3-aminophenyl)-2-(4-aminophneyl)-1,1,1,3,3,3,-hexafluoropropane, 1,1-di(3-aminophenyl)-1-phenylethane, 1,1-di(4-aminophenyl)-1-phenylethane, and 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminophenoxy)pyridine, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl] sulfide, bis[4-(4-aminophenoxy)phenyl] sulfide, bis[4-(3-aminophenoxy)phenyl] sulfone, bis[4-(4-aminophenoxy)phenyl] sulfone, bis[4-(3-aminophenoxy)phenyl] ether, bis[4-(4-aminophenoxy)phenyl] ether, 2,2-bis

[4-(3-aminophenoxy)phenyl]propane, 2,2-bis[4-(4-aminophenoxy)phenyl]propane, 2,2-bis[3-(3-aminophenoxy)phenyl]-1,1,1,3,3,3,-hexafluoropropane, 2,2-bis[4-(4-aminophenoxy)phenyl]-1,1,1,3,3,3,-hexafluoropropane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, 1,4-bis[4-(4-aminophenoxy)-α,α-dimethylbenzyl]benzene, 4,4'-bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, 4,4'-bis[4-(4-aminophenoxy)phenoxy]diphenyl sulfone, 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone, 6,6'-bis(3-aminophenoxy)-3,3,3',3'-tetramethyl-1,1'-spirobiindane, and 6,6'-bis(4-aminophenoxy)-3,3,3',3'-tetramethyl-1,1'-spirobiindane.

Also, an example thereof includes an aromatic diamine substituted a part of or the entire hydrogen atom on an aromatic ring with a substituent selected from fluoro group, methyl group, methoxy group, trifluoromethyl group, and trifluoromethoxy group. Also, an example thereof includes an aromatic diamine in which two or more aromatic rings are bonded by a single bond, and two or more amino groups are bonded directly or as a part of the substituent on each of the different aromatic rings. The aromatic diamine is, for example, represented by the following formula (A).

Formula (A)

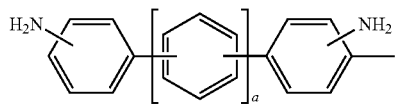

(wherein, a represents 0 or a natural number of 1 or more, and an amino group is bonded to a meta position or a para position with respect to bonds of benzene rings to each other.)

An example of the aromatic diamine represented by the formula (A) includes benzidine.

Furthermore, in the above-described formula (A), an example thereof includes an aromatic diamine that is not involved in a bond with another benzene ring and has a substituent in a position in which an amino group on the benzene ring is not substituted, and the aromatic diamine is represented by the following formula (B).

(Formula B)

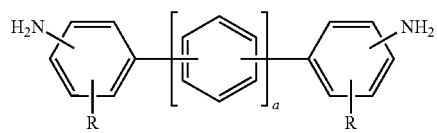

(wherein, a represents 0 or a natural number of 1 or more, R represents a substituent, and an amino group is bonded to a meta position or a para position with respect to bonds of benzene rings to each other.)

The substituent represented by R is a monovalent organic group, and the substituents may be bonded to each other. Examples of the substituent represented by R include alkyl groups having a carbon number of 3 or less such as methyl, haloalkyl groups (preferably, fluoroalkyl groups) having a carbon number of 3 or less such as trifluoromethyl, perfluoroethyl, and perfluoropropyl, and halogen atoms such as chloro and fluoro. As the substituent represented by R, preferably, a haloalkyl group is used, more preferably, a fluoroalkyl group is used. Specific examples of the aromatic diamine having a substituent and represented by the formula (B) include 2,2'-dimethyl-4,4'-diaminobiphenyl, 2,2'-ditrifluoromethyl-4,4'-diaminobiphenyl (also known as 2,2'-bis(trifluoromethyl)-4,4'-diaminobiphenyl (TFMB)), 3,3'-dichloro-4,4'-diaminobiphenyl, 3,3'-dimethoxy-4,4'-diaminobiphenyl, and 3,3'-dimethyl-4,4'-diaminobiphenyl.

Examples of the aliphatic diamine include bis(aminomethyl) ether, bis(2-aminoethyl) ether, bis(3-aminopropyl) ether, bis[(2-aminomethoxy)ethyl]ether, bis[2-(2-aminoethoxy)ethyl] ether, bis[2-(3-aminopropoxy)ethyl] ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethyleneglycol bis(3-aminopropyl) ether, diethyleneglycol bis(3-aminopropyl) ether, triethyleneglycol bis(3-aminopropyl) ether, ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-diaminocyclohexane, 1,3-diaminocyclohexane, 1,4-diaminocyclohexane, 1,2-di(2-aminoethyl)cyclohexane, 1,3-di(2-aminoethyl)cyclohexane, 1,4-di(2-aminoethyl)cyclohexane, bis(4-aminocyclohexyl)methane, 2,6-bis(aminomethyl)bicyclo[2.2.1]heptane, and 2,5-bis(aminomethyl)bicyclo[2.2.1]heptane.

As the diamine component, preferably, in view of obtaining excellent heat resistance, an aromatic diamine is used, more preferably, in view of further reducing a hygroscopic expansion coefficient, an aromatic diamine having a substituent having a fluorine atom (to be specific, a fluoroalkyl group and a halogen atom) is used, further more preferably, an aromatic diamine having a fluoroalkyl group as a substituent is used, particularly preferably, TFMB is used.

These diamine components can be used alone or in combination of two or more. Preferably, a plurality of aromatic diamines with different kinds are used, more preferably, a combination of phenylenediamine and a diamine having a fluoroalkyl group is used. The details of the combination are, for example, described in Japanese Unexamined Patent Publication No. 2013-100441.

The mole ratio of the aromatic diamine having a fluoroalkyl group with respect to the total mole number of the phenylenediamine and the diamine having a fluoroalkyl group is, for example, 15% or more, preferably 20% or more, and for example, 80% or less, preferably 50% or less.

The acid dianhydride component and the diamine component are appropriately selected from the above-described examples so that the insulating material has a desired hygroscopic expansion coefficient.

When the acid dianhydride component contains the 3,3',4,4'-biphenyltetracarboxylic dianhydride (BPDA), and the diamine component contains the 2,2'-ditrifluoromethyl-4,4'-diaminobiphenyl (TFMB), the polyimide contains a structure unit represented by the following formula (1).

Formula (1)

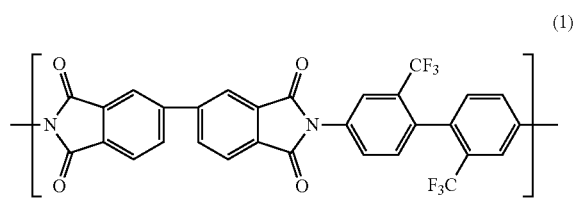

When the polyimide contains the structure unit represented by the formula (1), the warping of the mounting board 1 can be suppressed, while excellent heat resistance and a low hygroscopic expansion coefficient are ensured.

To be more specific, when the acid dianhydride component contains BPDA, and the diamine component contains TFMB, the polyimide contains a structure unit represented by the following formula (2).

Formula (2):

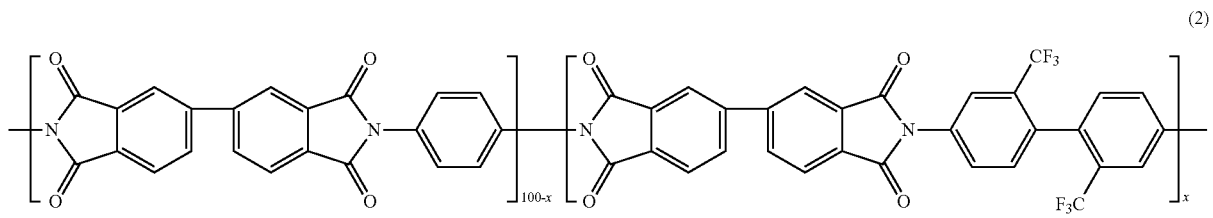

(wherein, x is 15 or more, and 80 or less.)

x is preferably 20 or more, and preferably 50 or less.

When x is the above-described lower limit or more, a low hygroscopic expansion coefficient can be ensured. When x is the above-described upper limit or less, the polyimide can be easily dissolved in a solvent at the time of preparation of a varnish.

The insulating material has a hygroscopic expansion coefficient of $15 \times 10^{-6}$/% RH or less, preferably $13 \times 10^{-6}$/% RH or less, and for example, $0 \times 10^{-6}$/% RH or more, preferably $1 \times 10^{-6}$/% RH or more.

When the hygroscopic expansion coefficient of the insulating material is above the above-described upper limit, the warping of the base insulating layer 4, and accordingly, the warping of the mounting board 1 cannot be suppressed. Meanwhile, when the hygroscopic expansion coefficient of the insulating material is the above-described upper limit or less, the warping of the base insulating layer 4 is suppressed, and accordingly, the warping of the mounting board 1 can be suppressed.

The hygroscopic expansion coefficient of the insulating material for forming the base insulating layer 4 is, for example, the same as the hygroscopic expansion coefficient of the base insulating layer 4 after curing in the mounting board 1.

The hygroscopic expansion coefficient of the insulating material is measured in accordance with the description of Examples of Japanese Unexamined Patent Publication No. 2013-100441.

The base insulating layer 4 has a thickness T1 of, for example, 12 µm or less, preferably 8 µm or less, and for example, 1 µm or more, preferably 3 µm or more. The thickness T1 of the base insulating layer 4 is adjusted so that the total sum of the thickness T1 of the base insulating layer 4 and a thickness T2 of the cover insulating layer 6 to be described later is within a desired range.

The conductive pattern 5 is provided at the upper side of the base insulating layer 4 so as to be in contact with the upper surface of the base insulating layer 4. The conductive pattern 5 includes the plurality of imaging element connecting terminals 10, the plurality of external component connecting terminals 11 (ref: FIG. 2), and a plurality of wires 9.

As shown in FIG. 1, the plurality of imaging element connecting terminals 10 are disposed in alignment at spaced intervals to each other so as to be in rectangular frame shapes in the central portion of the housing disposed portion 2. That is, as shown in FIG. 2, the plurality of imaging element connecting terminals 10 are provided so as to correspond to a plurality of terminals 25 (ref: FIG. 4) of the imaging element 21 to be mounted. The plurality of imaging element connecting terminals 10 are provided corresponding to the plurality of imaging element opening portions 7. Each of the plurality of imaging element connecting terminals 10 has a generally circular shape when viewed from the bottom. The imaging element connecting terminal 10 is formed so as to protrude downwardly when viewed in cross section (in side cross section and in front cross section). To be specific, the imaging element connecting terminal 10 integrally includes an outer peripheral portion 12 that is disposed at the outer periphery of the imaging element opening portion 7 and an inner side portion 13 that is disposed at the inside of the imaging element opening portion 7 so as to be recessed from the outer peripheral portion 12 inwardly. The lower surface (exposed surface) of the inner side portion 13 is exposed from the imaging element opening portion 7, and formed so as to be flat. The lower surface of the inner side portion 13 is formed so as to be flush with the lower surface of the base insulating layer 4.

As shown in FIG. 1, the plurality of external component connecting terminals 11 are disposed in alignment at spaced intervals to each other in the right-left direction in the rear end edge of the external component connecting portion 3. That is, the plurality of external component connecting terminals 11 are provided so as to correspond to a plurality of terminals (not shown) of the external component. The plurality of external component connecting terminals 11 are provided corresponding to the plurality of external component opening portions 8. Each of the plurality of external component connecting terminals 11 has a generally rectangular shape (rectangle-shaped) when viewed from the top. The external component connecting terminal 11 is disposed at the inside of the external component opening portion 8, and the lower surface thereof is exposed from the external component opening portion 8.

As shown in FIG. 2, the plurality of wires 9 include a plurality of connecting wires 14 and a plurality of ground wires 15.

The plurality of connecting wires 14 are provided so as to correspond to the plurality of imaging element connecting terminals 10 and the plurality of external component connecting terminals 11. To be specific, though not shown in FIG. 1, the connecting wire 14 is integrally formed with the imaging element connecting terminal 10 and the external component connecting terminal 11 so as to connect the imaging element connecting terminal 10 to the external component connecting terminal 11. That is, one end of the connecting wire 14 is continuous to the imaging element connecting terminal 10, and the other end thereof is continuous to the external component connecting terminal 11, so that the imaging element connecting terminal 10 is electrically connected to the external component connecting terminal 11.

The plurality of ground wires 15 are provided so as to correspond to the plurality of connecting wires 14. To be specific, the plurality of ground wires 15 are provided at the outer side of the plurality of connecting wires 14 along them. A ground terminal that is not shown is integrally connected to one end of the ground wire 15.

Examples of a material for the conductive pattern 5 include metal materials such as copper silver, gold, and nickel, and an alloy thereof, and solder. Preferably, copper is used.

The conductive pattern 5 has a thickness of, for example, 1 μm or more, preferably 3 μm or more, and for example, 15 μm or less, preferably 10 μm or less. The wire 9 has a width of, for example, 5 μm or more, preferably 10 μm or more, and for example, 100 μm or less, preferably 50 μm or less.

As shown in FIG. 2, the cover insulating layer 6 is provided at the upper side of the base insulating layer 4 and the conductive pattern 5 so as to cover the conductive pattern 5. That is, the cover insulating layer 6 is disposed so as to be in contact with the upper surface and the side surfaces of the conductive pattern 5, and a portion that is exposed from the conductive pattern 5 on the upper surface of the base insulating layer 4. The cover insulating layer 6 forms the upper layer of the mounting board 1. The outer shape of the cover insulating layer 6 is formed so as to be the same as that of the base insulating layer 4 except for a forming portion of the external component connecting terminal 11.

The cover insulating layer 6 contains the same insulating material as that of the base insulating layer 4 described above.

The hygroscopic expansion coefficient of the insulating material for forming the cover insulating layer 6 is, for example, the same as the hygroscopic expansion coefficient of the insulating material for forming the base insulating layer 4. The hygroscopic expansion coefficient of the insulating material is measured in accordance with the description of Examples of Japanese Unexamined Patent Publication No. 2013-100441. To be specific, the hygroscopic expansion coefficient of the insulating material for forming the cover insulating layer 6 is, for example, $15\times10^{-6}$/% RH or less, preferably $13\times10^{-6}$/% RH or less, and for example, $0\times10^{-6}$/% RH or more, preferably $1\times10^{-6}$/% RH or more. When the hygroscopic expansion coefficient of the insulating material is above the above-described upper limit, the warping of the cover insulating layer 6, and accordingly, the warping of the mounting board 1 cannot be suppressed. Meanwhile, when the hygroscopic expansion coefficient of the insulating material is the above-described upper limit or less, the warping of the cover insulating layer 6 is suppressed, and accordingly, the warping of the mounting board 1 can be suppressed.

The cover insulating layer 6 has the thickness T2 of, for example, 6 μm or less, preferably 4 μm or less, and for example, 1 μm or more, preferably 2 μm or more.

The thickness T2 of the cover insulating layer 6 is adjusted so that the total sum of the thickness T1 of the base insulating layer 4 and the thickness T2 of the cover insulating layer 6 to be described next is within a desired range.

The total sum (the total thickness of the insulating layers, T1+T2) of the thickness T1 of the base insulating layer 4 and the thickness T2 of the cover insulating layer 6 is, for example, 16 μm or less, preferably 13 μm or less, more preferably 10 μm or less, and for example, 1 μm or more, preferably 5 μm or more. The total thickness of the base insulating layer 4 and the cover insulating layer 6 is a thickness of the base insulating layer 4 and the cover insulating layer 6 that are in contact with each other in the thickness direction in a region in which the conductive pattern 5 is not formed.

When the total thickness of the base insulating layer 4 and the cover insulating layer 6 is above the above-described upper limit, a disadvantage (problem of the present invention) in which the mounting board 1 is easily warped is not generated.

Meanwhile, when the total thickness of the base insulating layer 4 and the cover insulating layer 6 is the above-described upper limit or less, a disadvantage (problem of the present invention) in which the mounting board 1 is easily warped is generated. However, the entire lower surface of the base insulating layer 4 is exposed downwardly, and the base insulating layer 4 contains the insulating material having a hygroscopic expansion coefficient of $15\times10^{-6}$/% RH or less, so that the warping of the mounting board 1 can be suppressed.

A ratio (T1/T2) of the thickness T1 of the base insulating layer 4 to the thickness T2 of the cover insulating layer 6 is, for example, 5 or less, preferably 1.8 or less, and for example, 1 or more, preferably 1.3 or more.

The mounting board 1 has a thickness (the total thickness of the base insulating layer 4, the conductive pattern 5, and the cover insulating layer 6) of, for example, 50 μm or less, preferably 30 μm or less, more preferably 20 μm or less, and for example, 1 μm or more, preferably 5 μm or more.

2. Method for Producing Imaging Element-Mounting Board

As shown in FIGS. 3A to 3D, the mounting board 1 is, for example, obtained by sequentially carrying out a metal supporting body preparing step, a base insulating layer forming step, a conductive pattern forming step, a cover insulating layer forming step, and a metal supporting body removing step.

Figure 3:
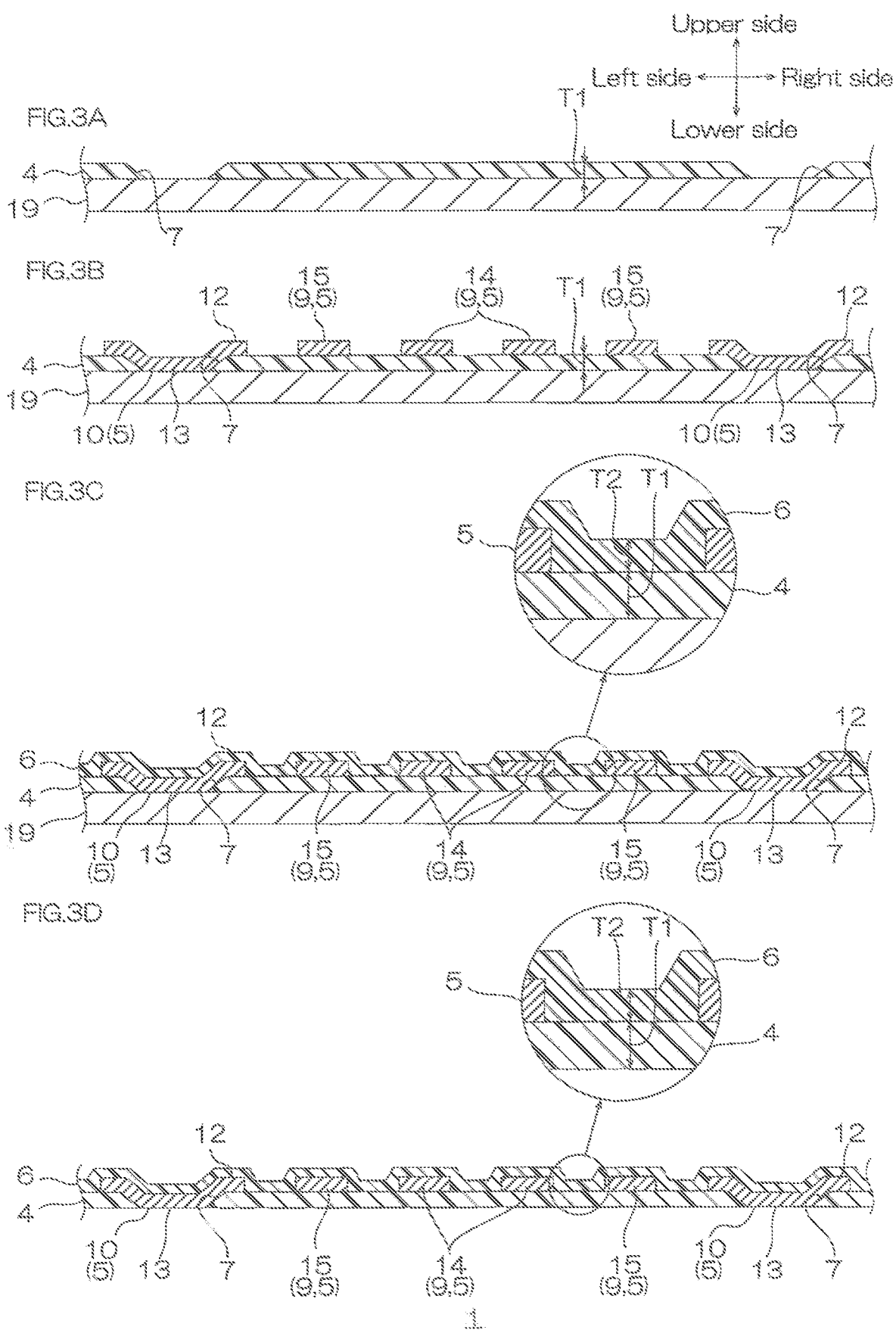
FIGS. 3A to 3D show production process views of the imaging element-mounting board shown in FIG. 2.

As shown in FIG. 3A, in the metal supporting body preparing step, the metal supporting body 19 is prepared.

The metal supporting body 19 has a generally rectangular (rectangle-shaped) flat plate shape (sheet shape) when viewed from the top extending in the plane direction.

The metal supporting body 19 is, for example, formed from a metal material such as stainless steel, 42-alloy, and aluminum. Preferably, the metal supporting body 19 is formed from stainless steel.

The metal supporting body 19 has a thickness of, for example, 5 μm or more, preferably 10 μm or more, and for example, 50 μm or less, preferably 30 μm or less.

The upper surface of the metal supporting body 19 is formed so as to be flat (smooth).

Subsequently, in the base insulating layer forming step, the base insulating layer 4 is formed on the upper surface of the metal supporting body 19. That is, the base insulating layer 4 having the imaging element opening portion 7 and the external component opening portion 8 is formed on the upper surface of the metal supporting body 19.

To be specific, first, a varnish of a photosensitive insulating material is prepared. When the insulating material is the polyimide, the varnish can contain a solvent that is capable of dissolving the above-described acid dianhydride component and diamine at an appropriate ratio, and furthermore, can contain an additive at an appropriate ratio. Examples of the additive include photosensitizers, sensitizers, polymerization terminators, chain transfer agents, leveling agents, plasticizers, surfactants, and defoaming agents.

Subsequently, the varnish is applied to the entire upper surface of the metal supporting body 19, and next, the solvent is dried. In this manner, a base film is formed. Thereafter, the base film is exposed to light via a photomask having a pattern corresponding to the imaging element opening portion 7 and the external component opening portion 8. Thereafter, the base film is developed, and then, cured by heating as needed.

As shown in FIG. 3B, in the conductive pattern forming step, the conductive pattern 5 is formed on the upper surface of the base insulating layer 4 and a portion that is exposed from the imaging element opening portion 7 and the external component opening portion 8 on the upper surface of the mounting board 1 in the above-described pattern. The conductive pattern 5 is, for example, formed by an additive method or the like.

As shown in FIG. 3C, in the cover insulating layer forming step, the cover insulating layer 6 is disposed on the upper surfaces of the conductive pattern 5 and the base insulating layer 4. The cover insulating layer forming step is carried out in the same manner as that of the base insulating layer forming step.

In this manner, the mounting board 1 including the base insulating layer 4, the conductive pattern 5, and the cover insulating layer 6 is obtained in a state of being supported by the metal supporting body 19. The mounting board 1 includes the metal supporting body 19, and is not yet removed. Thus, the mounting board 1 is not included in the flexible wiring circuit board of the present invention.

As shown in FIG. 3D, in the metal supporting body removing step, the metal supporting body 19 is removed.

As a removing method of the metal supporting body 19, for example, a method of peeling the metal supporting body 19 from the lower surface of the base insulating layer 4, a portion that is exposed from the imaging element opening portion 7 on the lower surface of the imaging element connecting terminal 10, and a portion that is exposed from the external component opening portion 8 on the lower surface of the external component connecting terminal 11 and a method of applying etching such as dry etching and wet etching to the metal supporting body 19 are used. Preferably, etching is used, more preferably, wet etching is used. In the wet etching, a chemical etching method in which spray or immersion is used by using a ferric chloride aqueous solution as an etching solution is used.

In this manner, the metal supporting body 19 is removed, so that the mounting board 1 including the base insulating layer 4, the conductive pattern 5, and the cover insulating layer 6 is obtained. The mounting board 1 does not include the metal supporting body 19, and preferably consists of only the base insulating layer 4, the conductive pattern 5, and the cover insulating layer 6. By removing the metal supporting body 19, the mounting board 1 can be used for uses to be described next, and can achieve the function and effect.

The mounting board 1 is, for example, used in an imaging element-mounting board for mounting an imaging element. That is, the mounting board 1 is provided in an imaging device such as camera module. The mounting board 1 is not the imaging device to be described next, and is one component of the imaging device, that is, a component for producing the imaging device. The mounting board 1 does not include an imaging element, and to be specific, is an industrially available device whose component alone is circulated.

3. Imaging Device

Next, an imaging device 20 including the mounting board 1 is described as one example of an imaging device of the present invention.

As shown in FIG. 4, the imaging device 20 includes the mounting board 1, the imaging element 21, the housing 22, an optical lens 23, and a filter 24.

The mounting board 1 shown in FIG. 2 is reversed upside down to be provided in the imaging device 20. That is, the mounting board 1 is disposed so that the base insulating layer 4 is the upper side (the other side in the thickness direction) and the cover insulating layer 6 is the lower side (one side in the thickness direction).

The imaging element 21 is a semiconductor element that converts light to electrical signals, and examples thereof include solid imaging elements such as CMOS sensor and CCD sensor. The imaging element 21 has a generally rectangular flat plate shape when viewed from the top, and though not shown, includes a silicon such as Si board, and a photo diode (photoelectric converting element) and a color filter that are disposed thereon. The plurality of terminals 25 corresponding to the imaging element connecting terminal 10 of the mounting board 1 are provided on the lower surface of the imaging element 21. The imaging element 21 has a thickness of, for example, 10 µm or more, preferably 50 µm or more, and for example, 1000 µm or less, preferably 500 µm or less.

The imaging element 21 is mounted on the mounting board 1. To be specific, the terminal 25 of the imaging element 21 is flip-chip mounted on the corresponding imaging element connecting terminal 10 of the mounting board 1 via a solder bump 26 or the like. In this manner, the imaging element 21 is disposed in the central portion of the housing disposed portion 2 of the mounting board 1 to be electrically connected to the imaging element connecting terminal 10 and the external component connecting terminal 11 of the mounting board 1.

The imaging element 21 is mounted on the mounting board 1 to constitute an imaging unit 27. That is, the imaging unit 27 includes the mounting board 1 and the imaging element 21 that is mounted thereon.

The housing 22 is disposed in the housing disposed portion 2 of the imaging element 21 at spaced intervals to the imaging element 21 so as to surround it. The housing 22 has a generally rectangular cylindrical shape when viewed from the top. In the upper end of the housing 22, a fixing portion for fixing the optical lens 23 is provided.

The optical lens 23 is disposed at the upper side of the mounting board 1 at spaced intervals to the mounting board 1 and the imaging element 21. The optical lens 23 has a generally circular shape when viewed from the top, and is fixed by the fixing portion so that light from the outside reaches the imaging element 21.

The filter 24 is disposed in the center in the up-down direction of the imaging element 21 and the optical lens 23 at spaced intervals thereto, and fixed to the housing 22.

In the mounting board 1, the total thickness (T1+T2) of the base insulating layer 4 and the cover insulating layer 6 is thin of 16 μm or less, so that a reduction in thickness can be achieved.

As shown in FIG. 2, in the mounting board 1, the entire lower surface of the base insulating layer 4 is exposed downwardly and the base insulating layer 4 contains the insulating material having a low hygroscopic expansion coefficient of $15 \times 10^{-6}$/% RH or less, so that the warping can be suppressed.

Among all, in a case where the mounting board 1 includes the metal supporting body 19, when the total thickness of the base insulating layer 4 and the cover insulating layer 6 is thin with respect to the thickness of the metal supporting body 19, the toughness of the metal supporting body 19 excessively binds the base insulating layer 4 and the cover insulating layer 6, and rather, a disadvantage of the warping becomes obvious. However, in one embodiment, the entire lower surface of the base insulating layer 4 is exposed downwardly (the metal supporting body 19 is not provided in the mounting board 1), so that the base insulating layer 4 and the cover insulating layer 6 can be released from the binding of the metal supporting body 19. In this way, the entire lower surface of the base insulating layer 4 is exposed, and the base insulating layer 4 is made from the insulating material having the low hygroscopic expansion coefficient, so that the insulating layers are hardly affected by the humidity even with the thin total thickness thereof, and thus, the warping can be suppressed.

Furthermore, when the insulating material is the polyimide having the structure unit represented by the formula (1), the warping of the mounting board 1 can be suppressed, while excellent heat resistance and the low hygroscopic expansion coefficient are ensured.

In the mounting board 1, the conductive pattern 5 includes the imaging element connecting terminal 10 and the external component connecting terminal 11 that are exposed from the base insulating layer 4 downwardly, so that the imaging element connecting terminal 10 and the external component connecting terminal 11 can be surely electrically connected to the imaging element 21 and the external component.

Also, the mounting board 1 is the imaging element-mounting board 1 that is mounted with the imaging element 21, so that an imaging device that is capable of achieving a reduction in thickness can be provided, and the warping of the mounting board 1 is suppressed. Thus, in the imaging device 20, the connection reliability of the mounting board 1 with the imaging element 21 can be improved.

According to the above-described method for producing the mounting board 1 shown in FIGS. 3A to 3D, the mounting board 1 that is capable of achieving a reduction in thickness and suppressing the warping can be obtained.

MODIFIED EXAMPLE

In modified examples, the same reference numerals are provided for members and steps corresponding to each of those in one embodiment, and their detailed description is omitted.

In one embodiment, the hygroscopic expansion coefficient of the insulating material for forming the cover insulating layer 6 is set to be the same as the hygroscopic expansion coefficient of the insulating material for forming the base insulating layer 4. However, the use of the hygroscopic expansion coefficient is not limited to this, and the hygroscopic expansion coefficient of the insulating material for forming the cover insulating layer 6 may be, for example, outside the range of the hygroscopic expansion coefficient of the insulating material for forming the base insulating layer 4. In short, at least the insulating material for forming the base insulating layer 4 may have a desired hygroscopic expansion coefficient.

In one embodiment, as the flexible wiring circuit board of the present invention, the imaging element-mounting board 1 (the mounting board 1) for mounting the imaging element 21 is described. However, the use of the flexible wiring circuit board is not limited to this. For example, the flexible wiring circuit board is preferably used for various uses that require a reduction in thickness and suppression of the warping, to be specific, in a mounting board for a pressure sensor, an acceleration sensor, a gyro sensor, an ultrasonic sensor, a fingerprint authentication sensor, or the like.

As shown in FIG. 2, in the mounting board 1 of one embodiment, the wire 9 includes the ground wire 15. However, for example, though not shown, the wire 9 may not include the ground wire 15. That is, the wire 9 can also consist of only the connecting wire 14.

As shown in FIG. 4, in the imaging device 20 of one embodiment, the imaging element 21 is flip-chip mounted on the mounting board 1. However, for example, though not shown, the imaging element 21 can be also mounted on the mounting board 1 by wire bonding.

Figure 5:
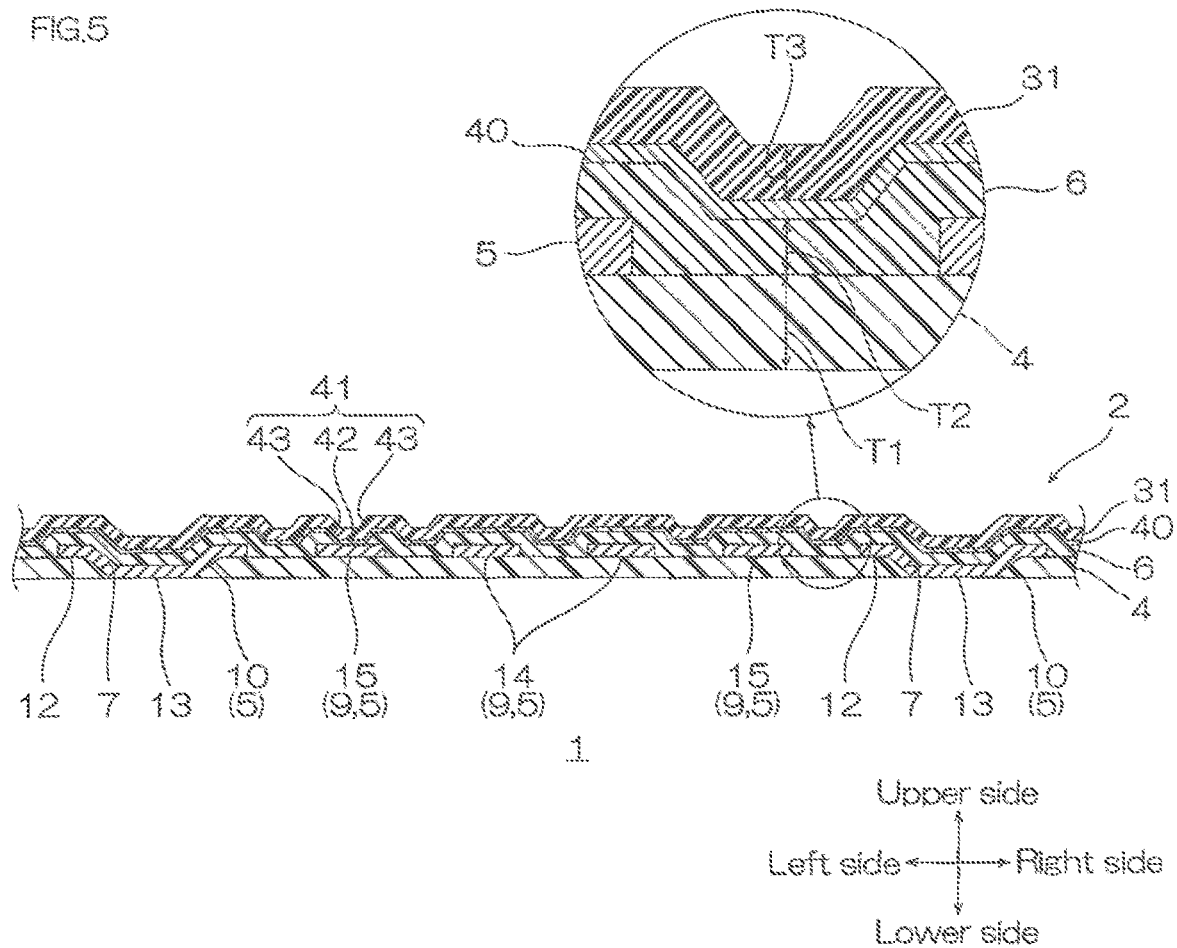
FIG. 5 shows a cross-sectional view of a modified example (embodiment including a shield layer and a second cover insulating layer) of the imaging element-mounting board shown in FIG. 2.

As shown in FIG. 2, in one embodiment, the mounting board 1 includes only the base insulating layer 4, the conductive pattern 5, and the cover insulating layer 6. However, for example, in the modified example, as shown in FIG. 5, the mounting board 1 further includes a shield layer 40 and a second cover insulating layer 31 as one example of a third insulating layer.

The mounting board 1 sequentially includes the base insulating layer 4, the conductive pattern 5, the cover insulating layer (the first cover insulating layer) 6, the shield layer 40, and the second cover insulating layer 31 upwardly.

The shield layer 40 is disposed at the upper side of the cover insulating layer 6 so as to be in contact with the upper surface of the cover insulating layer 6. The shield layer 40 is a layer that shields the electromagnetic waves from the outside, and has a sheet shape extending in the plane direction (the front-rear direction and the right-left direction).

The shield layer 40 is electrically connected to the ground wire 15. That is, the shield layer 40 is continuous to the ground wire 15. To be specific, the shield layer 40 includes a contact portion 41 that has a protruding shape downwardly and is in contact with the upper surface of the ground wire 15 in a portion that faces the ground wire 15.

The contact portion 41 includes a flat portion 42 that is in direct contact with the ground wire 15, and an inclined portion 43 that is integrally disposed so as to be continuous to the periphery of the flat portion 42.

The flat portion 42 has a flat plate shape extending in the plane direction. The inclined portion 43 extends in an inclination direction that crosses (inclines) in the up-down direction and the plane direction.

In this manner, the shield layer 40 is grounded via the ground wire 15.

The shield layer 40 is made from a conductor, and metal materials such as copper, chromium, nickel, gold, silver, platinum, palladium, titanium, tantalum, and solder, and an alloy thereof are used. Preferably, copper is used. The shield layer 40 has a thickness of, for example, 0.05 μm or more, preferably 0.1 μm or more, and for example, 3 μm or less, preferably 1 μm or less.

The second cover insulating layer 31 is provided at the upper side of the shield layer 40 so as to cover the shield layer 40. The outer shape of the second cover insulating layer 31 is formed so as to be the same as that of the cover insulating layer 6.

The second cover insulating layer 31 contains the same insulating material as that of the base insulating layer 4 described above. The hygroscopic expansion coefficient of the insulating material for forming the second cover insulating layer 31 is the same as the hygroscopic expansion coefficient of the insulating material for forming the base insulating layer 4. To be specific, the hygroscopic expansion coefficient of the insulating material for forming the second cover insulating layer 31 is, for example, $15 \times 10^{-6}$/% RH or less, preferably $13 \times 10^{-6}$/% RH or less, and for example, $0 \times 10^{-6}$/% RH or more, preferably $1 \times 10^{-6}$/% RH or more. When the hygroscopic expansion coefficient of the insulating material is above the above-described upper limit, the warping of the second cover insulating layer 31, and accordingly, the warping of the mounting board 1 cannot be suppressed. Meanwhile, when the hygroscopic expansion coefficient of the insulating material is the above-described upper limit or less, the warping of the second cover insulating layer 31 is suppressed, and accordingly, the warping of the mounting board 1 can be suppressed.

The second cover insulating layer 31 has a thickness T3 of, for example, 3 μm or less, preferably 2 μm or less, and for example, 0.1 μm or more, preferably 1 μm or more.

The total sum (the total thickness of the insulating layers, T1+T2+T3) of the thickness T1 of the base insulating layer 4, the thickness T2 of the cover insulating layer 6, and the thickness T3 of the second cover insulating layer 31 is, for example, 16 μm or less, preferably 13 μm or less, more preferably 10 μm or less, and for example, 1 μm or more, preferably 5 μm or more. When the total thickness of the base insulating layer 4, the cover insulating layer 6, and the second cover insulating layer 31 is the above-described upper limit or less, the warping of the second cover insulating layer 31 can be suppressed.

Furthermore, the second cover insulating layer 31 contains an insulating material having a hygroscopic expansion coefficient of $15 \times 10^{-6}$/% RH or less.

After the mounting board 1 of one embodiment is obtained in a state of being supported by the metal supporting body 19, the shield layer 40 and the second cover insulating layer 31 are formed on the upper surface of the first cover insulating layer 6 in this order, and subsequently, the metal supporting body 19 is removed, so that the mounting board 1 shown in FIG. 5 can be produced.

Although not shown in FIG. 2, a part of the conductive pattern 5 can be also exposed from the cover insulating layer 6.

Figure 6A:
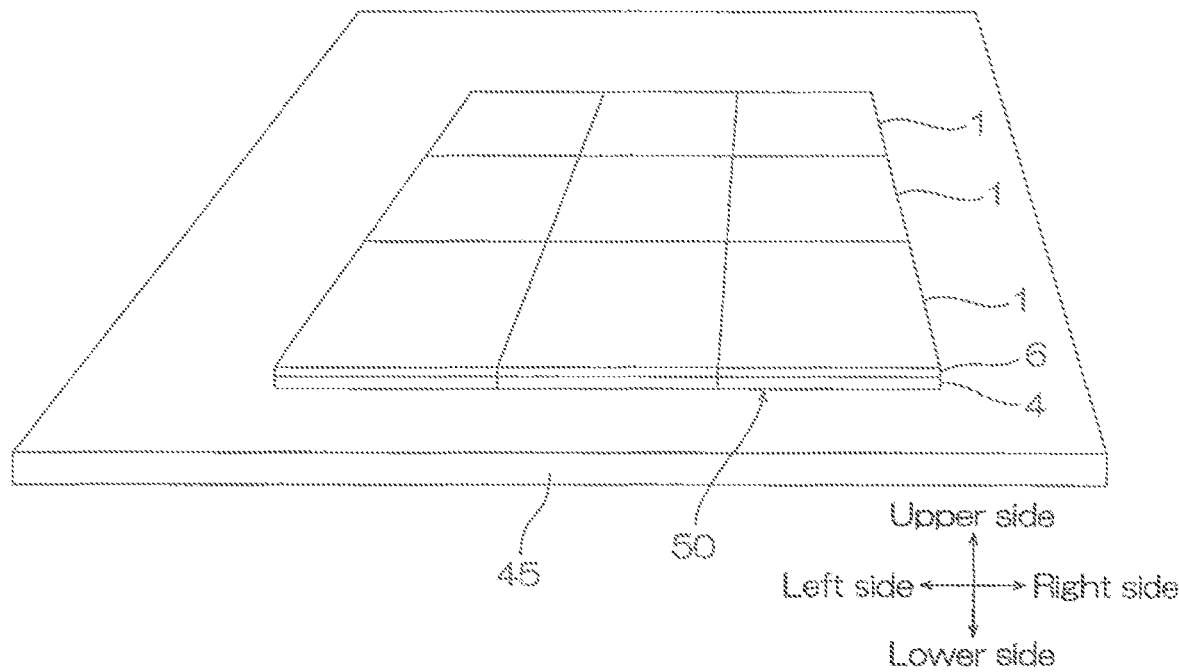
FIGS. 6A and 6B show front views of an evaluation method of warping in Examples.

Furthermore, as shown in FIG. 6A, the plurality of mounting boards 1 can also constitute as a board assembly sheet 50. The board assembly sheet 50 includes the plurality of mounting boards 1 in an alignment in the plane direction.

Each of the modified examples described above can achieve the same function and effect as that of one embodiment.

EXAMPLES

Next, the present invention is further described based on Production Examples, Comparative Production Examples, Examples, and Comparative Examples. The present invention is however not limited by these Production Examples, Comparative Production Examples, Examples, and Comparative Examples. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

Production Example 1

A 500-ml separable flask was charged with 4.0 g (20 mmol) of 2,2'-bis(trifluoromethyl)-4,4'-diaminobiphenyl (TFMB, aromatic diamine having a haloalkyl group as a substituent) and 8.65 g (80 mmol) of p-phenylenediamine (PPD, aromatic diamine) to be dissolved in 200 g of N-methyl-2-pyrolidone (NMP) that was dehydrated. Then, the dissolved solution was heated and stirred by being monitored with a thermocouple so that the temperature of the liquid was 50° C. by an oil bath under a nitrogen gas stream. After confirming it was completely dissolved, 29.4 g (100 mmol) of 3,3',4,4'-biphenyltetracarboxylic dianhydride (BPDA, aromatic acid dianhydride) was blended in the separable flask over 30 minutes to be thereafter stirred at 50° C. for five hours. Thereafter, the mixture was cooled to a room temperature, so that a polyimide precursor solution A was obtained.

Subsequently, 30 parts by mass of nifedipine (photosensitizer) was blended with respect to 100 parts by mass of the solid content of the polyimide precursor solution A, so that a photosensitive polyimide precursor solution A was prepared.

Comparative Production Example 1

A polyimide precursor solution B and subsequently, a photosensitive polyimide precursor solution B were prepared in the same manner as that of Production Example 1, except that 3.0 g (15 mmol) of 4,4'-diaminophenyl ether (ODA, 4,4'-oxybis(benzeneamine), aromatic diamine) and 9.19 g (85 mmol) of paraphenylenediamine (PPD, aromatic diamine) were used instead of 4.0 g (20 mmol) of 2,2'-bis(trifluoromethyl)-4,4'-diaminobiphenyl (TFMB) and 8.65 g (80 mmol) of p-phenylenediamine (PPD).

Example 1

As shown in FIG. 3A, the metal supporting body 19 having a thickness of 18 μm and made from stainless steel was prepared.

Next, the polyimide precursor solution A of Production Example 1 was applied to the upper surface of the metal supporting body 19 to be next dried at 80° C. for 10 minutes, so that a base film (polyimide precursor film) was formed. Subsequently, the base film was exposed to light via a photomask to be subsequently developed. Thereafter, the base film was heated (cured) at 360° C. for one hour under a nitrogen atmosphere, so that the base insulating layer 4 having the imaging element opening portion 7 and the external component opening portion 8, made from polyimide, and having a thickness of 10 μm was formed.

As shown in FIG. 3B, thereafter, the conductive pattern 5 having a thickness of 8 μm and made from copper was formed on the upper surface of the base insulating layer 4 and a portion that was exposed from the imaging element opening portion 7 and the external component opening portion 8 on the upper surface of the metal supporting body 19 by an additive method.

As shown in FIG. 3C, thereafter, the polyimide precursor solution of Production Example 1 was applied to the upper surfaces of the base insulating layer 4 and the conductive pattern 5 to be next dried at 80° C. for 10 minutes, so that a cover film (polyimide precursor film) was formed. Subsequently, the cover film was exposed to light via a photomask to be subsequently developed. Thereafter, the cover film was heated at 360° C. for one hour under a nitrogen atmosphere, so that the cover insulating layer 6 made from polyimide and having a thickness of 5 μm was obtained.

Thereafter, as shown in FIG. 3D, the metal supporting body 19 was removed by a chemical etching method in which an etching solution made of a ferric chloride aqueous solution was sprayed from the lower side. In this manner, the entire lower surface of the base insulating layer 4 was exposed.

In this manner, the mounting board 1 sequentially including the base insulating layer 4 that exposes the entire lower surface thereof, the conductive pattern 5, and the cover insulating layer 6 was obtained.

The polyimides of the base insulating layer 4 and the cover insulating layer 6 have a structure unit represented by the formula (2).

(wherein, x is 15.)

Example 4

The mounting board 1 sequentially including the base insulating layer 4, the conductive pattern 5, the cover insulating layer 6, the shield layer 40, and the second cover insulating layer 31 was obtained.

The base insulating layer 4, the conductive pattern 5, and the cover insulating layer 6 were formed in the same manner as that of Example 3.

The shield layer 40 having a thickness of 0.1 μm and made from copper was formed by sputtering, and subsequently, the second cover insulating layer 31 was formed from the polyimide having a thickness of 2 μm in the same manner as that of the base insulating layer 4.

Comparative Example 2

The process was carried out in the same manner as that of Example 2, except that the metal supporting body 19 was not removed, and the mounting board 1 including the metal supporting body 19 was produced.

In the mounting board 1, the entire lower surface of the base insulating layer 4 was covered with the metal supporting body 19.

Formula (2):

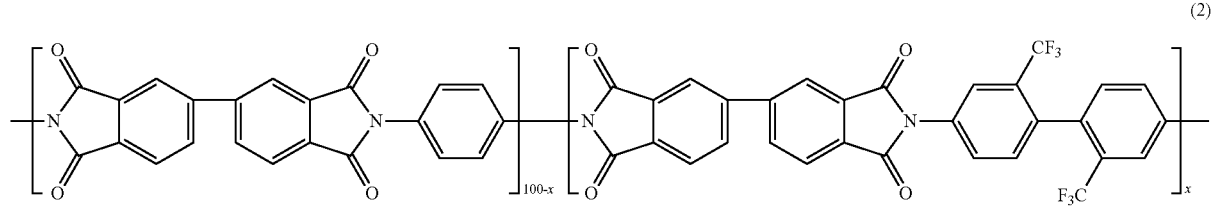

(2)

(wherein, x is 20.)

Examples 2 and 3 and Comparative Example 1

The mounting board 1 was obtained in the same manner as that of Example 1, except that the formulation, the thickness, the heating temperature, or the like of each of the layers were changed based on the description of Table 1.

The polyimides of the base insulating layer 4 and the cover insulating layer 6 of Comparative Example 1 have a structure unit represented by the following formula (3).

Comparative Example 3

The process was carried out in the same manner as that of Comparative Example 1, except that the metal supporting body 19 was not removed, and the mounting board 1 including the metal supporting body 19 was produced.

In the mounting board 1, the entire lower surface of the base insulating layer 4 was covered with the metal supporting body 19.

Each of the layer structures and the thickness of Examples and Comparative Examples is described in Table 1.

Formula (3)

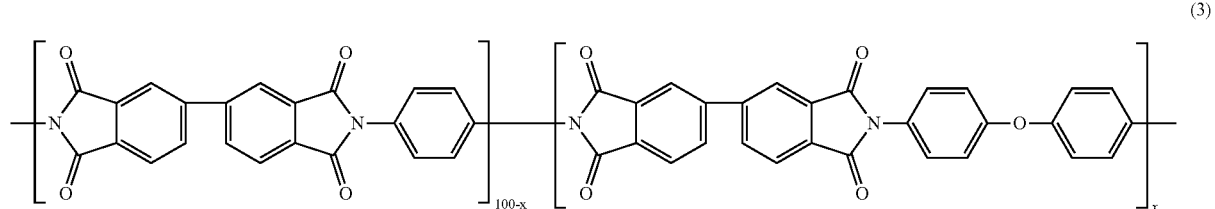

(3)

[Evaluation]

The following items were evaluated as for each of the mounting boards 1 of Examples and Comparative Examples. The results are shown in Table 1.

<Hygroscopic Expansion Coefficient>

The hygroscopic expansion coefficient of the base insulating layer 4 and the cover insulating layer 6 of each of the mounting boards 1 of Examples and Comparative Examples was measured.

To be specific, first, a laminated portion of the base insulating layer 4 and the cover insulating layer 6 of the mounting board 1 was collected as a sample.

Subsequently, the sample was sufficiently dried, and thereafter, the sample was retained for three hours to be stabilized under the environment of 5% RH at the inside of a chamber at 30° C. of a humidity-type thermomechanical analysis apparatus (HC-TMA4000SA, manufactured by Bruker AXS). Then, a load (196 mN) was applied to the sample and subsequently, the relative humidity thereof was changed to 75% RH to be retained for three hours to be stabilized. Then, the hygroscopic expansion coefficient was obtained from the sample elongation and an amount of change of the relative humidity (70% RH) by arithmetic processing of the humidity-type thermomechanical analysis apparatus.

<Warping>

The warping of the mounting board 1 was measured.

To be specific, as shown in FIG. 6A, first, the board assembly sheet 50 including the nine mounting boards 1 was prepared. The outer shape size of each of the mounting boards 1 was 15 mm×15 mm, and the outer shape size of the board assembly sheet 50 was 45 mm×45 mm.

Subsequently, the board assembly sheet 50 was disposed on the surface of a flat plate 45 under the environment of a temperature of 25° C. and the humidity of 60% RH.

Figure 6B:
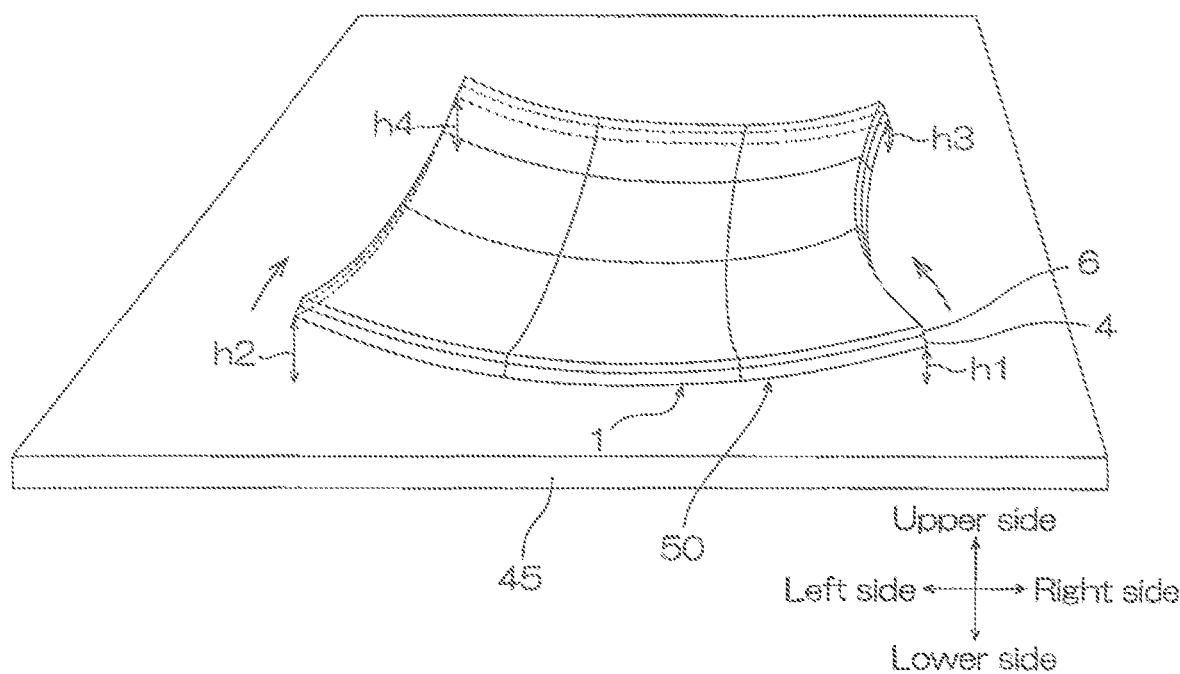

As shown in FIG. 6B, after the elapse of 24 hours, a height (h1, h2, h3, and h4) between each of the lower end portions at four peaks of the board assembly sheet 50 and the surface of the flat plate 45 was measured, and the average value thereof ([h1+h2+h3+h4]/4) was calculated as the warping.

[Table 1]

TABLE 1

| | | Ex. 1 | Ex. 2 | Ex. 3 | Ex. 4 |
|---|---|---|---|---|---|
| Second Cover Insulating Layer | Thickness T3 (μm) | — | — | — | 2 |
| | Varnish of Insulating Material | | | | Photosensitive Polyimide Precursor Solution A (Production Example 1) |
| Total Thickness (T1 + T2 + T3) of First Insulating Layer, Second Insulating Layer, and Third Insulating Layer | | | | | 10 |
| Shield Layer | Thickness (μm) | — | — | — | 0.1 |
| Cover Insulating Layer | Thickness T2 (μm) | 5 | 5 | 3 | 3 |
| | Varnish of Insulating Material | Photosensitive Polyimide Precursor Solution A (Production Example 1) | Photosensitive Polyimide Precursor Solution A (Production Example 1) | Photosensitive Polyimide Precursor Solution A (Production Example 1) | Photosensitive Polyimide Precursor Solution A (Production Example 1) |
| Total Thickness (T1 + T2) of First Insulating Layer and Second Insulating Layer | | 15 | 15 | 8 | 8 |
| Conductive Pattern | Thickness (μm) | 8 | 8 | 3 | 3 |
| Base Insulating Layer | Thickness T1 (μm) | 10 | 10 | 5 | 5 |
| | Varnish of Insulating Material | Photosensitive Polyimide Precursor Solution A (Production Example 1) | Photosensitive Polyimide Precursor Solution A (Production Example 1) | Photosensitive Polyimide Precursor Solution A (Production Example 1) | Photosensitive Polyimide Precursor Solution A (Production Example 1) |
| Metal Supporting Body | Thickness (μm) | — | — | — | — |
| Heating (Curing) Temperature (° C.) of Film | | 360 | 300 | 360 | 360 |
| Evaluation | Hygroscopic Expansion Coefficient ($\times 10^{-6}$/% RH) of First Insulating Layer and Second Insulating Layer | 12 | 10 | 12 | 12*[1] |
| | Warping (mm) | 0.8 | 0.6 | 0.5 | 0.5 |

| | | Comp. Ex. 1 | Comp. Ex. 2 | Comp. Ex. 3 |
|---|---|---|---|---|
| Second Cover Insulating Layer | Thickness T3 (μm) | — | — | — |
| | Varnish of Insulating Material | | | |
| Total Thickness (T1 + T2 + T3) of First Insulating Layer, Second Insulating Layer, and Third Insulating Layer | | | | |
| Shield Layer | Thickness (μm) | — | — | — |
| Cover Insulating Layer | Thickness T2 (μm) | 5 | 5 | 5 |
| | Varnish of Insulating Material | Photosensitive Polyimide Precursor Solution B | Photosensitive Polyimide Precursor Solution A | Photosensitive Polyimide Precursor Solution B |

TABLE 1-continued

|  |  | (Comparative Production Example 1) | (Production Example 1) | (Comparative Production Example 1) |
|---|---|---|---|---|
| Total Thickness (T1 + T2) of First Insulating Layer and Second Insulating Layer | | 15 | 15 | 15 |
| Conductive Pattern | Thickness (μm) | 8 | 8 | 8 |
| Base Insulating Layer | Thickness T1 (μm) | 10 | 10 | 10 |
| | Varnish of Insulating Material | Photosensitive Polyimide Precursor Solution B (Comparative Production Example 2) | Photosensitive Polyimide Precursor Solution A (Production Example 1) | Photosensitive Polyimide Precursor Solution B (Comparative Production Example 2) |
| Metal Supporting Body | Thickness (μm) | — | 18 | 18 |
| Heating (Curing) Temperature (° C.) of Film | | 300 | 360 | 390 |
| Evaluation | Hygroscopic Expansion Coefficient ($\times 10^{-6}$/% RH) of First Insulating Layer and Second Insulating Layer | 19 | 12 | 19 |
| | Warping (mm) | 12.8 | 4.1 | 5.3 |

*[1]Hygroscopic Expansion Coefficient of First Insulating Layer, Second Insulating Layer, and Third Insulating Layer While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The flexible wiring circuit board of the present invention is provided in the imaging device.

DESCRIPTION OF REFERENCE NUMERALS

1 Mounting board (imaging element-mounting board)
4 Base insulating layer
5 Conductive pattern
6 Cover insulating layer
10 Imaging element connecting terminal
11 External component connecting terminal
20 Imaging device
21 Imaging element
31 Second cover insulating layer
40 Shield layer
50 Board assembly sheet
T1 Thickness of base insulating layer
T2 Thickness of cover insulating layer
T3 Thickness of second cover insulating layer

The invention claimed is:

1. A flexible wiring circuit board comprising:
a first insulating layer, a conductive pattern, and a second insulating layer sequentially toward one side in a thickness direction, wherein
the entire other-side surface in the thickness direction of the first insulating layer is exposed toward the other side in the thickness direction,
a total thickness of the first insulating layer and the second insulating layer is 16 μm or less, and
at least the first insulating layer contains an insulating material having a hygroscopic expansion coefficient of $15\times10^{-6}$/% RH or less.

2. The flexible wiring circuit board according to claim 1, wherein
the insulating material is a polyimide containing a structure unit represented by the following formula (1).

Formula (1)

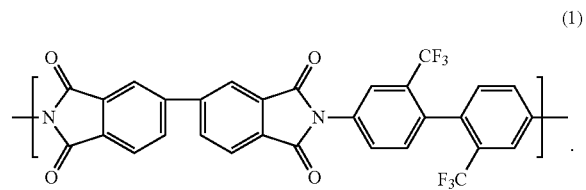

(1)

3. The flexible wiring circuit board according to claim 1, wherein
the conductive pattern has a terminal exposed from the first insulating layer toward the other side in the thickness direction.

4. The flexible wiring circuit board according to claim 1, wherein
a part of the conductive pattern is exposed from the second insulating layer toward one side in the thickness direction.

5. The flexible wiring circuit board according to claim 1 further comprising:
a shield layer and a third insulating layer and comprising:
the first insulating layer, the conductive pattern, the second insulating layer, the shield layer, and the third insulating layer sequentially toward one side in the thickness direction, wherein
a total thickness of the first insulating layer, the second insulating layer, and the third insulating layer is 16 μm or less.

6. The flexible wiring circuit board according to claim 5, wherein
the third insulating layer contains an insulating material having a hygroscopic expansion coefficient of $15\times10^{-6}$/% RH or less.

7. The flexible wiring circuit board according to claim 1 being:

an imaging element-mounting board for mounting an imaging element.

8. An imaging device comprising:
the imaging element-mounting board according to claim 7 and
an imaging element mounted on the imaging element-mounting board.

9. A method for producing the flexible wiring circuit board according to claim 1 comprising the steps of:
preparing a metal supporting board,
forming a first insulating layer, a conductive pattern, and a second insulating layer sequentially at one side in a thickness direction of the metal supporting board, and
removing the metal supporting board.

10. The flexible wiring circuit board according to claim 1, wherein the first insulating layer is located to the nearest of the other side in the flexible wiring circuit board so that the entire other surface of the thickness direction is exposed toward the other side of the thickness direction, and
wherein the conductive pattern has a terminal exposed from the first insulating layer toward the other side in the thickness direction.

* * * * *